(12) United States Patent
Yuan et al.

(10) Patent No.: US 7,670,878 B2
(45) Date of Patent: Mar. 2, 2010

(54) METHOD FOR MANUFACTURING SEMICONDUCTOR PACKAGE

(75) Inventors: Jing Li Yuan, Gyunggi-do (KR); Jae Cheon Doh, Gyunggi-do (KR); Tae Hoon Kim, Gyunggi-do (KR); Si Joong Yang, Gyunggi-do (JP); Seung Wook Park, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 92 days.

(21) Appl. No.: 12/153,378

(22) Filed: May 16, 2008

(65) Prior Publication Data

US 2008/0286904 A1    Nov. 20, 2008

(30) Foreign Application Priority Data

May 17, 2007   (KR) .................. 10-2007-0047995

(51) Int. Cl.
*H01L 21/44* (2006.01)
(52) U.S. Cl. .................. 438/113; 438/106; 438/118; 438/127; 257/E21.505; 257/E21.514
(58) Field of Classification Search ......... 438/106–119, 438/127; 257/E21.514, E21.505
See application file for complete search history.

(56) References Cited

U.S. PATENT DOCUMENTS

| 5,448,014 | A | 9/1995 | Kong et al. |
| 7,042,188 | B2 | 5/2006 | Miura et al. |
| 7,307,775 | B2 * | 12/2007 | Patel et al. .................. 359/291 |
| 2003/0148553 | A1 * | 8/2003 | Hartwell et al. ............. 438/109 |
| 2004/0222764 | A1 | 11/2004 | Miura et al. |
| 2005/0167795 | A1 * | 8/2005 | Higashi ..................... 257/678 |
| 2007/0262470 | A1 * | 11/2007 | Ichiryu et al. ............... 257/783 |

FOREIGN PATENT DOCUMENTS

JP   2004-336879   11/2004

* cited by examiner

*Primary Examiner*—Thanh Nguyen

(57) ABSTRACT

Provided is a method for manufacturing a semiconductor package. In the method, a wafer for a cap substrate is provided. The wafer for the cap substrate includes a plurality of vias and via electrodes on a lower surface. A wafer for a device substrate is provided. The wafer for the device substrate includes a circuit unit and a connection electrode on an upper surface. The wafer for the cap substrate and the wafer for the device substrate are primarily bonded by a medium of a primary adhesive. A trench is formed to expose the upper surface of the wafer for the device substrate to an outside along an outer edge of the primary adhesive. A secondary bonding operation is performed by a medium of a secondary adhesive to electrically connect the via electrode and the connection electrode. The wafer for the device substrate is diced along a virtual cut line.

10 Claims, 5 Drawing Sheets

METHOD FOR MANUFACTURING SEMICONDUCTOR PACKAGE

CROSS-REFERENCE TO RELATED APPLICATIONS

This application claims the priority of Korean Patent Application No. 10-2007-47995 filed on May 17, 2007 in the Korean Intellectual Property Office, the disclosure of which is incorporated herein by reference.

BACKGROUND OF THE INVENTION

1. Field of the Invention

The present invention relates to a method for manufacturing a semiconductor package, and more particularly, to a method for manufacturing a semiconductor package solidly bonding a cap substrate and a device substrate having different thermal expansion coefficients through two times of bonding.

2. Description of the Related Art

A semiconductor package forms a circuit unit on a device substrate and covers a cap substrate having an external electrode and a through electrode electrically connected with the circuit unit to protect the circuit unit.

The semiconductor package is used for a surface acoustic wave (SAW) filter having an interdigital transducer (IDT) electrode which is sensitive to the influence of an external environment and thus requires blocking from the external environment, or an image sensor having an image forming region. These parts are manufactured at a wafer level for miniaturization.

Examples of a related art regarding a method of manufacturing the semiconductor package include U.S. Pat. No. 5,448,014 and Japanese Laid Open Patent No. 2004-366879.

However, since the method for manufacturing the semiconductor package passes through a process of bonding at high temperature, bonding is twisted or crack is generated in the case where the device substrate and the cap substrate have different thermal expansion coefficients. Accordingly, there is a limitation of having to manufacture the device substrate and the cap substrate using only the same material or materials having similar thermal expansion properties. Accordingly, even a material of the cap substrate merely covering the device substrate to protect or seal a circuit unit such as an IDT electrode provided inside the cap substrate should be manufactured using the same material as that of an expensive device substrate. Therefore, there has been a limit in cost reduction and a process required for dealing with the expensive substrate is complicated.

SUMMARY OF THE INVENTION

An aspect of the present invention provides a method that can solidly bond a wafer for a cap substrate and a wafer for a device substrate having different thermal expansion coefficients to provide diversity in selecting a substrate material, reducing manufacturing costs using an inexpensive substrate material, and simplify a manufacturing process.

According to an aspect of the present invention, there is provided a method for manufacturing a semiconductor package, the method including: providing a wafer for a cap substrate including a plurality of vias for external terminals, and a via electrode connected to the vias on a lower surface; providing a wafer for a device substrate including a circuit unit and a connection electrode connected to the circuit unit on an upper surface; primarily bonding the wafer for the cap substrate and the wafer for the device substrate by a medium of a primary adhesive; forming a trench exposing the upper surface of the wafer for the device substrate to an outside along an outer edge of the primary adhesive; performing a secondary bonding by a medium of a secondary adhesive so that the via electrode and the connection electrode are electrically connected to each other; and dicing the wafer for the device substrate along a virtual cut line.

The primary adhesive may include a primary upper adhesive coated on a lower surface of the wafer for the cap substrate, and a primary lower adhesive coated on a position of an upper surface of the wafer for the device substrate corresponding to the primary upper adhesive.

The primary adhesive may be coated on a lower surface of the wafer for the cap substrate.

The primary adhesive may be continuously coated to surround outer edges of the circuit unit and the connection electrodes and seal the circuit unit when the wafer for the cap substrate and the wafer for the device substrate are bonded to each other.

The secondary adhesive may be provided to an upper surface of the connection electrode.

The primary adhesive may be epoxy, and the secondary adhesive may be eutectic solder.

The secondary bonding may be performed at a higher temperature than that of the primary bonding.

The primary bonding may be performed at a range of 80-100° C., and the secondary bonding may be performed at a range of 200-300° C.

The trench may be provided at a position where the trench overlaps the virtual cut line.

The wafer for the cap substrate and the wafer for the device substrate may be formed of materials different from each other in a thermal expansion coefficient.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1A:
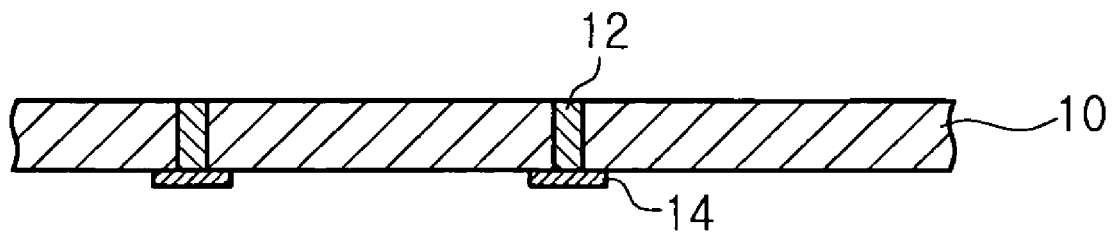
FIGS. 1A and 1B are cross-sectional views illustrating providing a wafer for a cap substrate according to the present invention.
Figure 1B:
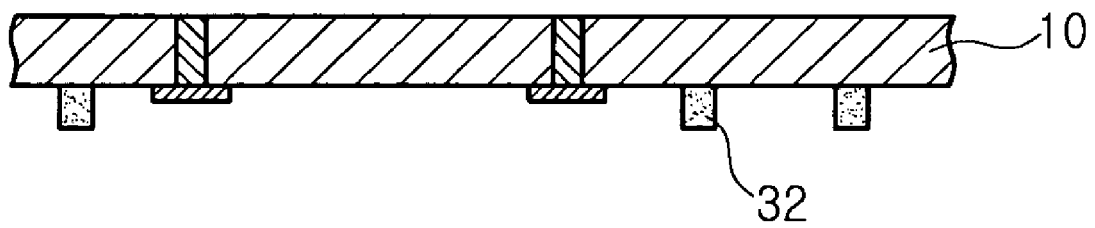
Figure 2A:
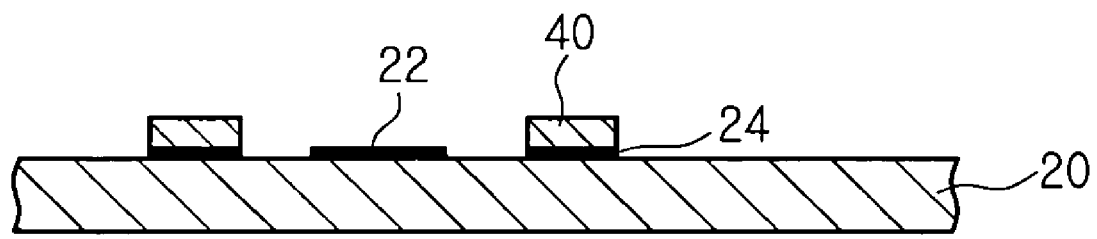
FIGS. 2A and 2B are cross-sectional views illustrating providing a wafer for a device substrate according to the present invention.
Figure 2B:
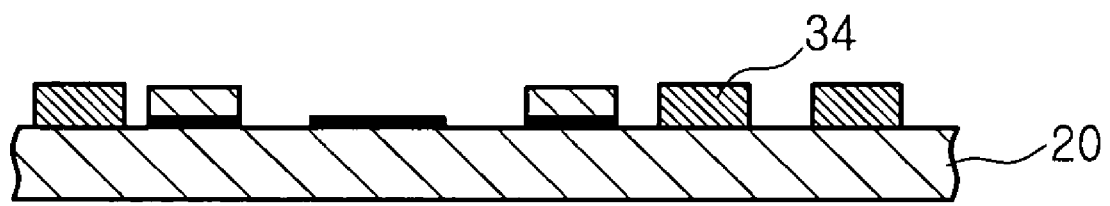
Figure 3A:
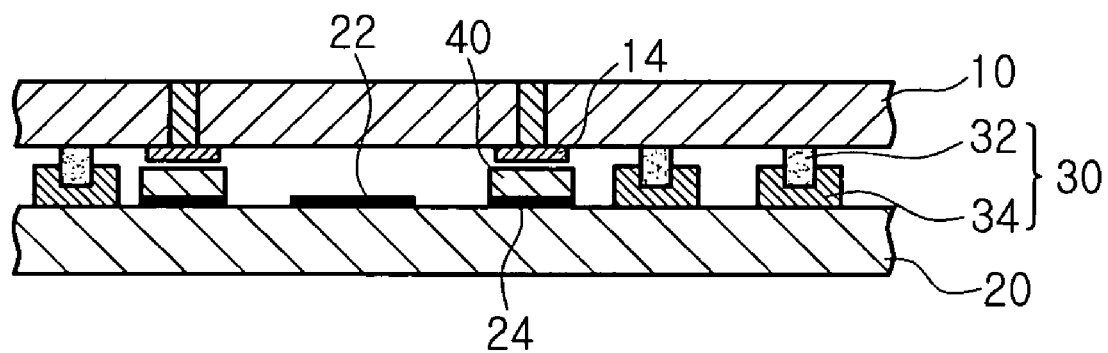
FIGS. 3A and 3B are cross-sectional views illustrating primarily bonding a wafer for a cap substrate and a wafer for a device substrate according to the present invention.
Figure 3B:
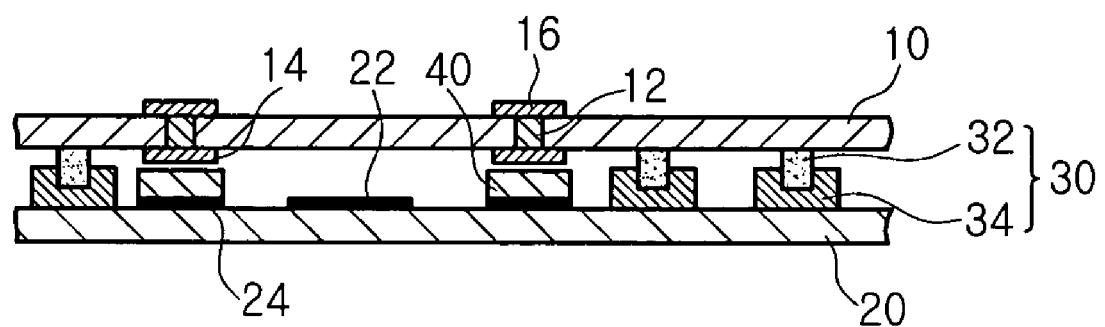
Figures 4A, 4B, 4C:
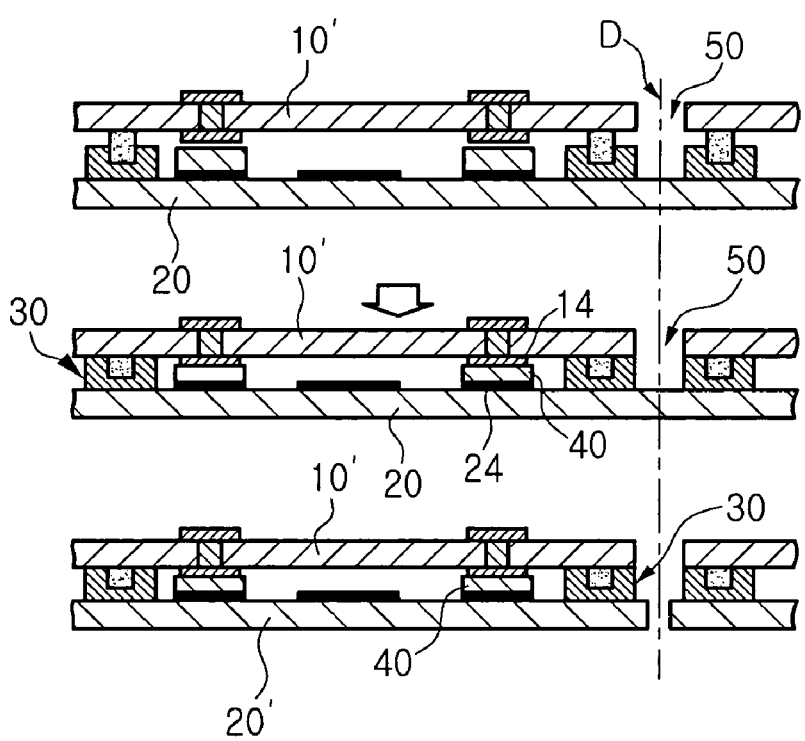
FIGS. 4A, 4B, and 4C are cross-sectional views illustrating secondarily bonding a wafer for a cap substrate and a wafer for a device substrate according to the present invention.
Figure 5:
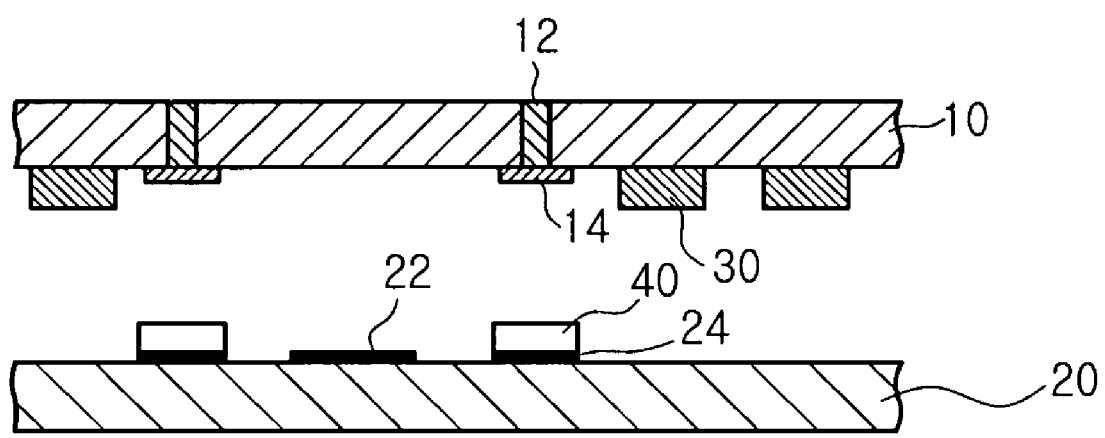
FIG. 5 is a cross-sectional view illustrating a wafer for a cap substrate and a wafer for a device substrate according to another embodiment of the present invention.

FIGS. 1A and 1B are cross-sectional views illustrating providing a wafer for a cap substrate according to the present invention, FIGS. 2A and 2B are cross-sectional views illustrating providing a wafer for a device substrate according to the present invention, FIGS. 3A and 3B are cross-sectional views illustrating primarily bonding a wafer for a cap substrate and a wafer for a device substrate according to the present invention, FIGS. 4A, 4B, and 4C are cross-sectional views illustrating secondarily bonding a wafer for a cap substrate and a wafer for a device substrate according to the present invention, and FIG. 5 is a cross-sectional view illustrating a wafer for a cap substrate and a wafer for a device substrate according to another embodiment of the present invention.

Referring to FIG. 1A, in an operation of providing the wafer 10 for the cap substrate, via holes 12 for external terminals are provided in the wafer 10 for the cap substrate, the via holes 12 are filled with a conductive filler or coated in its inner surface with a conductive material, and via electrodes 14 are provided on the lower surface of the wafer 10 for the cap substrate.

Though not shown, instead of the via holes 12, blind vias are formed in the lower surface of the wafer 10 for the cap substrate and then the upper surface of the wafer 10 for the cap substrate is polished to expose the vias to the outside.

A primary upper adhesive 32 is provided to the lower surface of the wafer 10 for the cap substrate as illustrated in FIG. 1B. At this point, the primary upper adhesive 32 can be a polymer-based resin, for example, epoxy.

Referring to FIG. 2A, in an operation of providing the wafer 20 for the device substrate, a circuit unit 22 such as an IDT electrode and a connection electrode 24 are provided on the upper surface of the wafer 20 for the device substrate, and the circuit unit 22 and the connection electrode 24 are electrically connected to each other through a pattern circuit pattern-printed on the wafer 20 for the device substrate.

Also, a secondary adhesive 40 is provided on the upper surface of the connection electrode 24 to electrically connect the via electrode 14 with the connection electrode 24. The secondary adhesive 40 is a conductive material, and eutectic solder in general.

Also, referring to FIG. 2B, a primary lower adhesive 34 is coated along the outer edges of the circuit unit 22 and the connection electrode 24 on the upper surface of the wafer 20 for the device substrate. At this point, the primary lower adhesive 34 can be a polymer-based resin, for example, epoxy.

At this point, the primary lower adhesive 34 is continuously coated on a region corresponding to the primary upper adhesive 32 to seal the circuit unit 22 and thus protect the circuit unit 22 from the outside when the wafer 10 for the cap substrate and the wafer 20 for the device substrate are bonded to each other.

The primarily bonding of the wafer 10 for the cap substrate and the wafer 20 for the device substrate is performed with the primary upper adhesive 32 and the primary lower adhesive 34 contacting each other as illustrated in FIG. 3A.

However, as illustrated in FIG. 5, the primary adhesive 30 can be provided on only the lower surface of the wafer 10 for the cap substrate. At this point, a sufficiently large amount of the primary adhesive 30 is continuously coated on the outer edge of the via electrode 14 to surround the circuit unit 22 provided on the upper surface of the wafer 20 for the device substrate during a bonding operation. The wafer 10 for the cap substrate contacts the upper surface of the wafer 20 for the device substrate, so that bonding is performed.

A temperature range suitable for the bonding is a temperature range allowing only the primary adhesive to be thermally fused without almost no thermal expansions of the wafer 10 for the cap substrate and the wafer 20 for the device substrate. In the case where the primary adhesive is epoxy, the temperature range is in the range of 80-100° C. but is not limited thereto and can change depending on the material of the wafer or the kind of the adhesive.

At this point, the via electrode 14 and the eutectic solder 40 can be separated from each other with a gap or contact each other but are not completely bonded to each other.

Referring to FIG. 3B, lapping, grinding, or polishing is performed on the outer surface of the wafer 10 for the cap substrate and/or the wafer 20 for the device substrate to reduce the thickness of the semiconductor package, and then external terminals 16 connected to the via holes 12 are provided on the upper surface of the wafer 10 of the cap substrate.

Though not shown, in the case where the via holes 12 of the wafer 10 for the cap substrate are blind vias, lapping, grinding, or polishing is performed on the upper surface of the wafer 10 for the cap substrate to expose the vias to the outside, and then external terminals 16 connected to the via holes 12 can be provided on the upper surface of the wafer 10 of the cap substrate.

Referring to FIG. 4A, in an operation of forming a trench, the wafer 10 for the cap substrate is separated along a virtual cut line D to expose the upper surface of the wafer 20 for the device substrate to the outside along the outer edge of the primary adhesive 30.

At this point, a separating method can be etching or half dicing. A processed width of the trench may be the same as a gap between the primary adhesive and an adjacent primary adhesive provided on the upper surface of the wafer 20 for the device substrate, or smaller than the gap.

The wafer 10 for the cap substrate is separated into respective cap substrates 10' by forming the trench 50.

Accordingly, even when the wafer 10 for the cap substrate and the wafer 20 for the device substrate are formed of materials having different thermal expansion coefficients, twisting or crack due to a difference in the thermal expansion during a bonding operation can be prevented while the secondary bonding process is performed at high temperature.

Accordingly, twisting or crack can be prevented even when a LTO (liTaO$_3$) wafer is used as the wafer 20 for the device substrate and a Si wafer formed of a material having a great difference in a thermal expansion compared to the wafer 20 for the device substrate is used as the wafer 10 for the cap substrate.

Referring to FIG. 4B, in an operation of bonding the wafer 10 for the cap substrate and the wafer 20 for the device substrate, the semiconductor package including the trench 50 at a wafer level is secondarily bonded at a temperature higher than temperature of the primary bonding, and a pressure can be additionally applied.

For the bonding process, various wafer bonding processes such as an eutectic bonding, a high temperature adhesive, and a fusion bonding can be used.

In the operation of the secondary bonding, the via electrodes 14 and the connection electrodes 24 are eutectic-bonded by the medium of the eutectic solder 40 so that they are electrically connected and bonded.

In the case where the secondary adhesive is an eutectic solder in the eutectic bonding, the secondary bonding is performed at the temperature range of 200-300° C. but not limited thereto and can be performed at various temperature ranges depending on the kind of the adhesive.

When the secondary bonding is performed as described above, the cap substrate 10' and the wafer 20 for the device substrate are closely bonded even more, and the inside of the substrate is completely sealed by the primary adhesive 30.

Also, the via electrodes 14 and the connection electrodes 24 are bonded to each other by the secondary adhesive 4, and accordingly, the circuit unit 22 is electrically connected to the external electrodes 16.

In an operation of dicing, the wafer 20 for the device substrate is cut along the virtual cut line D to separate the wafer into respective semiconductor packages as illustrated in FIG. 4C.

The semiconductor package provided by the above-described method can prevent a bonding defect such as twisting of a wafer or crack generation during a process of bonding the cap substrate 10' and a device substrate 20' formed of materials different from each other and having a great difference in a thermal expansion coefficient.

According to the present invention, the wafer for the cap substrate and the wafer for the device substrate are primarily bonded at low temperature, the wafer for the cap substrate is separated into respective chip sizes, and the secondary bonding is performed at high temperature, so that a defect such as crack and twisting that occurs during a bonding operation can be prevented even when the thermal expansion coefficients of the wafer for the cap substrate and the wafer for the device substrate are different from each other.

Accordingly, since diversity is secured in selecting a material of the wafer for the cap substrate, a wafer for a cap substrate formed of more inexpensive material can be used, and thus manufacturing costs can be reduced.

Also, since a process-easy material is selected for the wafer for the cap substrate, a manufacturing process can be simplified even more.

While the present invention has been shown and described in connection with the exemplary embodiments, it will be apparent to those skilled in the art that modifications and variations can be made without departing from the spirit and scope of the invention as defined by the appended claims.

What is claimed is:

1. A method for manufacturing a semiconductor package, the method comprising:
   providing a wafer for a cap substrate comprising a plurality of vias for external terminals, and via electrodes connected to the vias on a lower surface;
   providing a wafer for a device substrate comprising a circuit unit and connection electrodes connected to the circuit unit on an upper surface;
   primarily bonding the wafer for the cap substrate and the wafer for the device substrate by a medium of a primary adhesive;
   forming a trench exposing the upper surface of the wafer for the device substrate to an outside along an outer edge of the primary adhesive;
   performing a secondary bonding by a medium of a secondary adhesive so that the via electrodes and the connection electrodes are electrically connected to each other; and
   dicing the wafer for the device substrate along a virtual cut line.

2. The method of claim 1, wherein the primary adhesive comprises:
   a primary upper adhesive coated on a lower surface of the wafer for the cap substrate; and
   a primary lower adhesive coated on a position of an upper surface of the wafer for the device substrate corresponding to the primary upper adhesive.

3. The method of claim 1, wherein the primary adhesive is coated on a lower surface of the wafer for the cap substrate.

4. The method of claim 1, wherein the primary adhesive is continuously coated to surround outer edges of the circuit unit and the connection electrodes and seal the circuit unit when the wafer for the cap substrate and the wafer for the device substrate are bonded to each other.

5. The method of claim 1, wherein the secondary adhesive is provided to upper surfaces of the connection electrodes.

6. The method of claim 1, wherein the primary adhesive comprises epoxy, and the secondary adhesive comprises an eutectic solder.

7. The method of claim 1, wherein the secondary bonding is performed at a higher temperature than that of the primary bonding.

8. The method of claim 7, wherein the primary bonding is performed at a range of 80-100° C., and the secondary bonding is performed at a range of 200-300° C.

9. The method of claim 1, wherein the trench is provided at a position where the trench overlaps the virtual cut line.

10. The method of claim 1, wherein the wafer for the cap substrate and the wafer for the device substrate are formed of materials different from each other in a thermal expansion coefficient.

* * * * *